(12) United States Patent
Shibata et al.

(10) Patent No.: US 10,483,922 B2
(45) Date of Patent: Nov. 19, 2019

(54) PHOTOELECTRIC CONVERSION DEVICE

(71) Applicant: CANON KABUSHIKI KAISHA, Tokyo (JP)

(72) Inventors: Masanori Shibata, Inagi (JP); Hirotaka Shiomichi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 94 days.

(21) Appl. No.: 15/893,013

(22) Filed: Feb. 9, 2018

(65) Prior Publication Data

US 2018/0241357 A1    Aug. 23, 2018

(30) Foreign Application Priority Data

Feb. 17, 2017   (JP) ................. 2017-028419

(51) Int. Cl.
*H03F 1/30* (2006.01)
*G01J 1/44* (2006.01)
(Continued)

(52) U.S. Cl.
CPC ............... *H03F 1/303* (2013.01); *G01J 1/44* (2013.01); *H03F 1/26* (2013.01); *H03F 3/087* (2013.01); *H03F 3/45071* (2013.01); *H03F 3/45475* (2013.01); *H01L 27/1443* (2013.01); *H01L 27/1446* (2013.01); *H01L 31/02019* (2013.01); *H03F 2200/234* (2013.01); *H03F 2200/249* (2013.01); *H03F 2200/417* (2013.01);
(Continued)

(58) Field of Classification Search
CPC ...... H03F 1/303; H03F 3/087; H03F 3/45475; H03F 1/26; H03F 3/45071; H03F 2203/45526; H03F 2203/45138; H03F 2200/249; H03F 2203/45171; H03F 2200/417; H03F 2200/234; G01J 1/44; H01L 27/1446; H01L 27/1443; H01L 31/02019; H03K 17/687
USPC ...................................................... 250/214 A
See application file for complete search history.

(56) References Cited

U.S. PATENT DOCUMENTS 5,299,170 A    3/1994  Shibata et al.
5,350,269 A    9/1994  Azuma et al.
(Continued)

FOREIGN PATENT DOCUMENTS

JP         2011109331 A    6/2011

*Primary Examiner* — Seung C Sohn
(74) *Attorney, Agent, or Firm* — Venable LLP (57) ABSTRACT

A photoelectric conversion device is provided. The device comprises a light receiving element, first and second transimpedance amplifiers configured to receive a signal of the light receiving element and output a voltage, a differential operation amplifier configured to perform a differential amplification for outputs of the first and second transimpedance amplifiers and a switching unit. The switching unit includes an output switching unit configured to switch connections between a first state where the light receiving element and the first transimpedance amplifier are connected and a second state where the light receiving element and the second transimpedance amplifier are connected, and a capacitance adjusting unit connected to an input terminal of each of the first and second transimpedance amplifiers and configured to adjust a capacitance value of the first and transimpedance amplifier and/or a capacitance value of the second transimpedance amplifier.

18 Claims, 5 Drawing Sheets

(51) Int. Cl.
    *H03F 3/45*         (2006.01)
    *H03F 1/26*         (2006.01)
    *H03F 3/08*         (2006.01)
    *H01L 31/02*       (2006.01)
    *H01L 27/144*      (2006.01)
    *H03K 17/687*     (2006.01)

(52) U.S. Cl.
    CPC .............. *H03F 2203/45138* (2013.01); *H03F 2203/45171* (2013.01); *H03F 2203/45526* (2013.01); *H03K 17/687* (2013.01)

(56) References Cited

U.S. PATENT DOCUMENTS

| | | | |
|---|---|---|---|
| 7,205,845 B2 * | 4/2007 | Harms | H03F 3/082 330/110 |
| 8,884,204 B2 | 11/2014 | Shibata et al. | |
| 9,057,819 B2 | 6/2015 | Shibata et al. | |
| 2004/0130397 A1 * | 7/2004 | Mactaggart | H03F 3/08 330/308 |
| 2017/0341413 A1 | 11/2017 | Endo et al. | |

* cited by examiner

PHOTOELECTRIC CONVERSION DEVICE

BACKGROUND OF THE INVENTION

Field of the Invention

The present invention relates to a photoelectric conversion device.

Description of the Related Art

Photoelectric conversion devices that use a transimpedance amplifier for transforming current outputted from a light receiving element into a voltage are known. Japanese Patent Laid-Open No. 2011-109331 describes a configuration of a transimpedance amplifier.

SUMMARY OF THE INVENTION

In the configuration described in Japanese Patent Laid-Open No. 2011-109331, because two transimpedance amplifier input sides connected to a differential amplifier circuit have mutually different configurations, the values of the parasitic capacitance of the two transimpedance amplifier input sides will differ. In the case where a power supply voltage connected to the photoelectric conversion device fluctuates due to disturbance noise, parasitic capacitance will propagate, and the fluctuation amount of the noise inputted into the two transimpedance amplifiers may differ depending on a difference in parasitic capacitance values. In the case where a difference arises in the size of the noise that enters the two transimpedance amplifiers, a component due to the difference in the size of the noise will be superimposed onto the signal that is transformed from current into voltage by the two transimpedance amplifiers and outputted from the differential amplifier circuit. As a result, the ability to remove power supply voltage fluctuations (power supply rejection ratio: PSRR) worsens.

Some embodiments of the present invention provide a technique for photoelectric conversion devices that is advantageous with respect to power supply voltage fluctuations.

According to some embodiments, a photoelectric conversion device, comprising: a light receiving element unit including a light receiving element; first and second transimpedance amplifiers configured to receive a signal outputted from the light receiving element unit and output a voltage corresponding to the signal; a differential operation amplifier configured to perform a differential amplification for outputs of the first and second transimpedance amplifiers; and a switching unit, wherein the switching unit includes: an output switching unit configured to switch connections between a first state where the light receiving element unit and the first transimpedance amplifier are connected and a second state where the light receiving element unit and the second transimpedance amplifier are connected; and a capacitance adjusting unit connected to an input terminal of each of the first and second transimpedance amplifiers and configured to adjust a capacitance value of an input node of the first and transimpedance amplifier and/or a capacitance value of an input node of the second transimpedance amplifier, is provided.

According to some other embodiments, a photoelectric conversion device, comprising: a light receiving element unit including a light receiving element; first and second transimpedance amplifiers configured to receive a signal outputted from the light receiving element unit and output a voltage corresponding to the signal; a differential operation amplifier configured to perform a differential amplification for outputs of the first and second transimpedance amplifiers; and a switching unit, wherein the switching unit includes: one or more first switches arranged between the light receiving element unit and an input node of the first transimpedance amplifier; one or more second switches arranged between the light receiving element unit and an input node of the second transimpedance amplifier; one or more third switches arranged between the first transimpedance amplifier and one or more first nodes; and one or more fourth switches arranged between the second transimpedance amplifier and one or more second nodes, is provided.

According to some other embodiments, a photoelectric conversion device, comprising: a light receiving element unit including a light receiving element; first and second transimpedance amplifiers configured to receive a signal outputted from the light receiving element unit and output a voltage corresponding to the signal; a differential operation amplifier configured to perform a differential amplification for outputs of the first and second transimpedance amplifiers; and a switching unit, wherein the switching unit has: a first switch connected between the light receiving element unit and the first transimpedance amplifier; a second switch connected between a node other than the light receiving element unit and the first transimpedance amplifier; a third switch connected between the light receiving element unit and the second transimpedance amplifier; and a fourth switch connected between a node other than the light receiving element unit and the second transimpedance amplifier, is provided.

Further features of the present invention will become apparent from the following description of exemplary embodiments (with reference to the attached drawings).

DESCRIPTION OF THE EMBODIMENTS

Specific embodiments of a photoelectric conversion device according to the present invention will be described hereinafter, with reference to the attached drawings. Note that, in the following description and the drawings, the same reference numerals are given to configurations that are the same across a plurality of drawings. Accordingly, common configurations are described with mutual reference to the plurality of drawings, and description of configurations to which common reference numerals are given is abbreviated as appropriate.

Figure 1A:
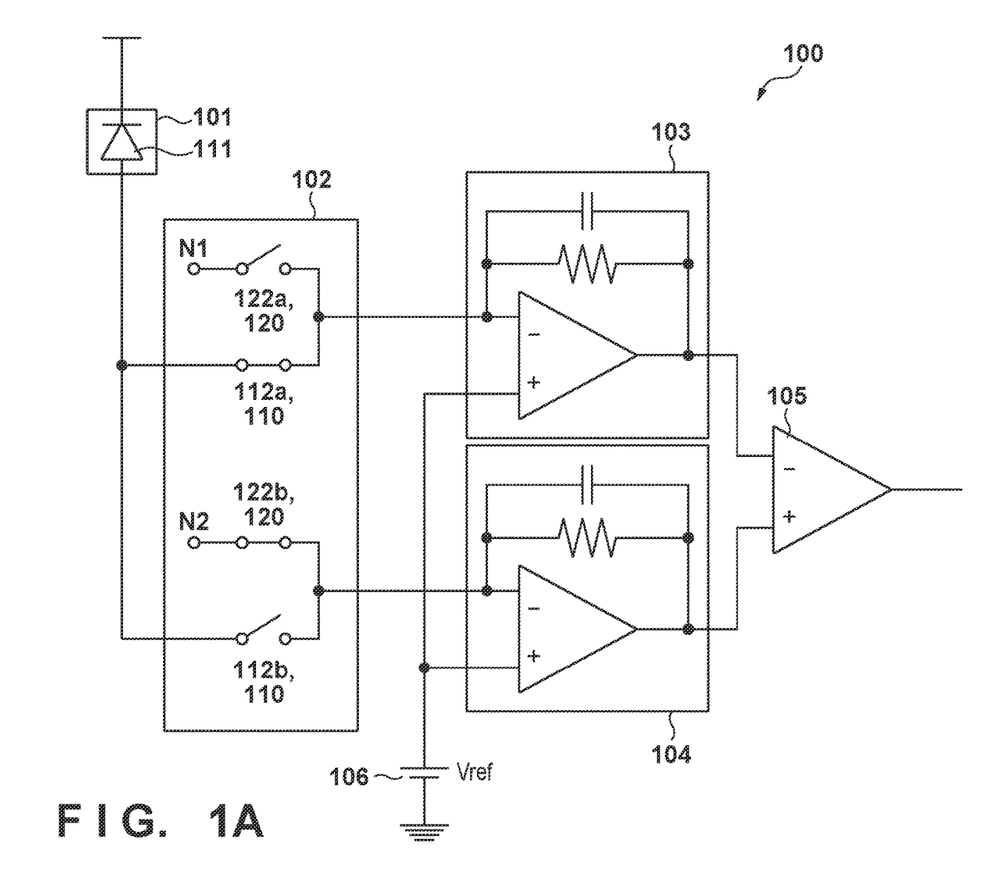
FIGS. 1A-1C are circuit diagrams which illustrate a configuration of a photoelectric conversion device according to embodiments of the present invention.
Figure 1B:
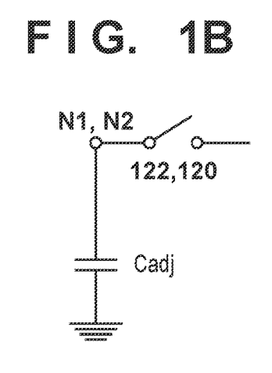
Figure 1C:
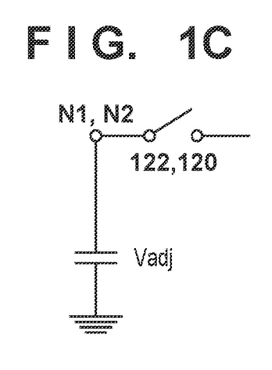

A configuration of the photoelectric conversion device according to embodiments of the present invention will be described with reference to FIGS. 1A-1C, 2A, and 2B. FIGS. 1A-1C are circuit diagrams that illustrate a configuration of a photoelectric conversion apparatus 100 in the first embodiment of the present invention. The photoelectric conversion apparatus 100 includes a light receiving element unit 101 including a light receiving element 111, a switching unit 102, two transimpedance amplifiers 103 and 104, and a differential operation amplifier 105.

The light receiving element unit 101 via the switching unit 102 outputs to the transimpedance amplifiers 103 and 104 a signal generated in accordance with light that is incident on the light receiving element 111. The cathode of the light receiving element 111 arranged on the light receiving element unit 101 is connected to the power supply voltage, and the anode is connected to a switch 112 of an output switching unit 110 of the switching unit 102. (In the present specification, as with a switch 112a, in the case where a particular switch is indicated among the plurality of switches 112, a suffix such as "a" or "b" is added after the reference numeral. Furthermore, in the case where there are multiple switches 112a, a suffix such as "-a" or "-1" is added such as with the switch 112a-a in order to indicate a particular switch 112a. The same is true for other components.) The configuration of the switching unit 102 is described later. Outputs of the switching unit 102 are connected to inverting terminals which are input terminals of the two transimpedance amplifiers 103 and 104. To non-inverting terminals of the transimpedance amplifiers 103 and 104, a reference voltage Vref is supplied from a reference voltage unit 106 arranged in a photoelectric conversion apparatus 100. The output of the two transimpedance amplifiers 103 and 104 is inputted into the differential operation amplifier 105.

The switching unit 102 includes the output switching unit 110 and a capacitance adjusting unit 120, which are respectively configured by a plurality of switches. The output switching unit 110 is arranged to establish a connection relation between the light receiving element unit 101 and the transimpedance amplifiers 103 and 104. The capacitance adjusting unit 120 is arranged for adjusting the capacitance value of the input node of the transimpedance amplifiers 103 and 104. In the circuit configuration illustrated in FIG. 1A, the switching unit 102 comprises the following four switches. The switch 112a of the output switching unit 110 is arranged between the anode of the light receiving element 111 arranged on the light receiving element unit 101 and the input terminal of the transimpedance amplifier 103. The switch 112b of the output switching unit 110 is arranged between the anode of the light receiving element 111 arranged on the light receiving element unit 101 and the input terminal of the transimpedance amplifier 104. The switch 122a of the capacitance adjusting unit 120 is arranged between the input terminal (input node) of the transimpedance amplifier 103 and a node N1 for adjusting the capacitance value on the input node of the transimpedance amplifier 103. The switch 122b of the capacitance adjusting unit 120 is arranged between the input terminal (input node) of the transimpedance amplifier 104 and the node N2 for adjusting the capacitance value on the input node of the transimpedance amplifier 104. In the present embodiment, the nodes N1 and N2 are floating. The switches 122a and 122b connected to the nodes N1 and N2 can function as dummy switches. Details are described later.

Next, operation of the switching unit 102 will be described. The light receiving element 111 arranged in the light receiving element unit 101 outputs to the switching unit 102 a signal (current signal) according to the amount of light incident on the light receiving element 111. The switching unit 102 switches the switches 112a and 112b of the output switching unit 110 to supply a signal generated in the light receiving element 111 to one of the two transimpedance amplifiers 103 and 104. For example, consider a case where the signal generated in the light receiving element 111 is supplied to the transimpedance amplifier 103. In such a case, the switch 112a arranged between the light receiving element unit 101 and the input terminal of the transimpedance amplifier 103 enters an on state (conductive state). Also, the switch 112b arranged between the light receiving element unit 101 and the input terminal of the transimpedance amplifier 104 enters an off state (non-conductive state). Furthermore, the switch 122a between the node N1 of the capacitance adjusting unit 120 and the transimpedance amplifier 103 enters an off state and the switch 122b between the node N2 and the transimpedance amplifier 104 enters an on state.

The signal inputted into the transimpedance amplifier 103 is converted by a resistive element included in the transimpedance amplifier 103 into a voltage in accordance with the amount of light received, and the voltage is outputted from the transimpedance amplifier 103. Meanwhile, the reference voltage Vref is inputted by a virtual connection to ground of the amplifier to the inverting terminal of the transimpedance amplifier 104, and the reference voltage Vref is outputted from the transimpedance amplifier 104. The output of the two transimpedance amplifiers 103 and 104 is inputted into the differential operation amplifier 105. The differential operation amplifier 105 performs a differential amplification on the output of the two transimpedance amplifiers 103 and 104, and the output according to the difference in output of the two transimpedance amplifiers 103 and 104 is obtained. As a result, the photoelectric conversion apparatus 100 can monitor the output voltage in accordance with the amount of light received by the light receiving element 111 by inputting the signal outputted from the light receiving element 111 into one of the transimpedance amplifiers 103 and 104.

In the present embodiment, the switch 122a and the switch 112a operate to be in mutually different states to the switch 122b and the switch 112b respectively. So, operation is such that the number of switches in the on state out of the switches 112a and 122a that are connected to the transimpedance amplifier 103 and the number of switches in the on state out of the switches 112b and 122b connected to the transimpedance amplifier 104 approach each other. Also, operation is such that the number of switches in the off state out of the switches 112a and 122a that are connected to the transimpedance amplifier 103 and the number of switches in the off state out of the switches 112b and 122b connected to the transimpedance amplifier 104 approach each other. In the present embodiment, operation is such that the numbers of switches in the on state and the numbers of switches in the off state out of the switches connected to the two transimpedance amplifiers 103 and 104 respectively become the same number.

Here, consider the case where disturbance noise is inputted into the power supply voltage. Disturbance noise propagates parasitic capacitance of the output switching unit 110 of the switching unit 102 from the light receiving element unit 101, is inputted into the transimpedance amplifiers 103 and 104, and is outputted from the differential operation amplifier 105. In such a case, equivalent disturbance noise will be inputted into the overall system of the photoelectric conversion apparatus 100, such as the reference voltage Vref, and parasitic capacitance of the switching unit 102 may propagate, be inputted into the transimpedance amplifiers 103 and 104, and be outputted from the differential operation amplifier 105.

Figure 2A:
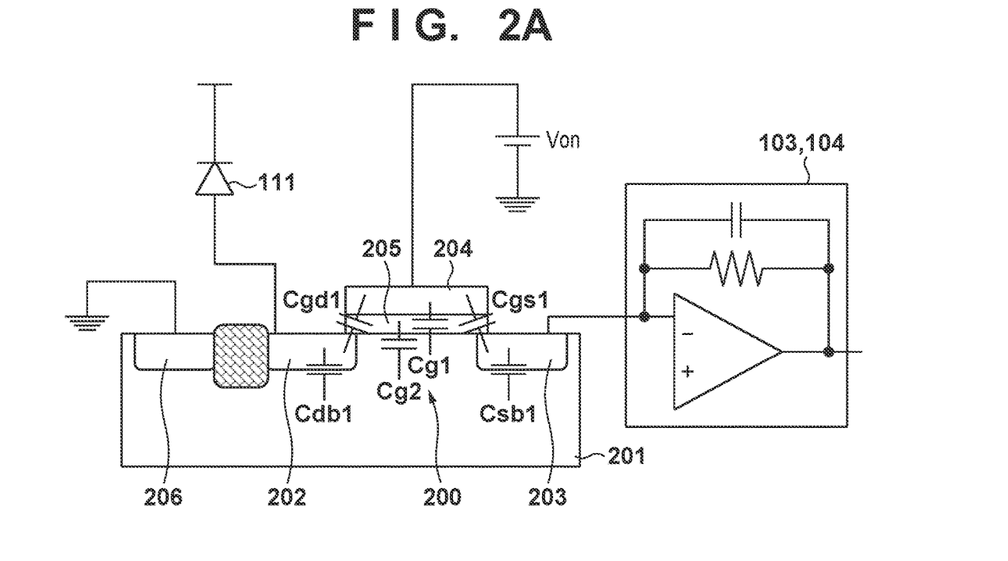
FIGS. 2A and 2B are sectional views which illustrate a configuration of a switch of a switching unit of FIG. 1A.
Figure 2B:
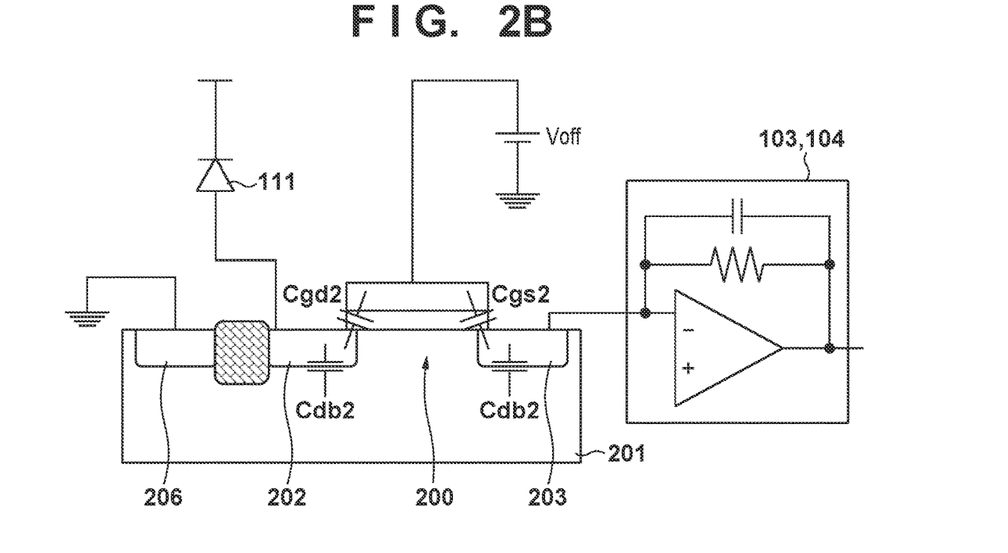

Using FIGS. 2A and 2B, a parasitic capacitance component included in the switches 112 and 122 of the switching unit 102 will be described. FIGS. 2A and 2B are sectional views illustrating examples of configurations of each of the switches 112 and 122 of the switching unit 102. Each switch of the switching unit 102 may be configured by a CMOS switch including a MOS transistor. The configurations illustrated in FIGS. 2A and 2B are sectional views of a case where an NMOS switch 200 is used for the switch. The NMOS switch 200 includes a P-type well region 201, an N-type drain region 202, an N-type source region 203, a gate electrode 204, an insulating film 205, and a P-type well electrode 206. The P-type well region 201 is, for example, a P-type semiconductor layer, and is connected to a ground voltage via the P-type well electrode 206. The N-type drain region 202 is connected to the anode of the light receiving element 111. The N-type source region 203 is connected to inverting terminals which are input terminals of the transimpedance amplifiers 103 and 104.

In a case where Von, which corresponds to the power supply voltage, is applied to the gate electrode 204, and the NMOS switch 200 enters the on state, the parasitic capacitance components that result on the power supply voltage side in the NMOS switch 200, as illustrated in FIG. 2A, are the capacitance Cg1 across the gate electrode 204—channel, the capacitance Cgd1 across the gate electrode 204—the N-type drain region 202, and the capacitance Cgs1 across the gate electrode 204—the N-type source region 203. These capacitances are combined, and become the parasitic capacitance Cvd1 on the power supply voltage side:

$$Vgd1 = Cg1 + Cgd1 + Cgs1$$

Also, parasitic capacitance component arises on the ground voltage side includes the capacitance Cg2 across the channel—the P-type well region 201, the capacitance Cdb1 across the N-type drain region 202—the P-type well region 201, and the capacitance Csb1 across the N-type source region 203—the P-type well region 201. The parasitic capacitance Cgnd1 on the ground voltage side is:

$$Cgnd1 = Cg2 + Cdb1 + Csb1$$

In a case where the voltage Voff, which corresponds to the ground voltage, is applied to the gate electrode 204, and the NMOS switch 200 entered the off state, the parasitic capacitance components that result on the power supply voltage side and the ground side in the NMOS switch 200, as illustrated in FIG. 2B, are the capacitance Cgd2 across the gate electrode 204—the N-type drain region 202, and the capacitance Cgs2 across the gate electrode 204—the N-type source region 203. The parasitic capacitance Cvd2 on the power supply voltage side is:

$$Cvd2 = Cgd2 + Cgs2$$

Also, the parasitic capacitance components that arises in the ground voltage side are the capacitance Cdb2 across the N-type drain region 202—the P-type well region 201, and the capacitance Csb2 across the N-type source region 203—the P-type well region 201. The parasitic capacitance component Cgnd2 on the ground voltage side is:

$$Cgnd2 = Cdb2 + Csb2$$

Here, Cvd1>Cvd2 and Cgnd1>Cgnd2. As described above, the capacitance value of the parasitic capacitance differs in the cases where the switches of the switching unit 102 are respectively in the on state and in the off state. As a result, when a difference in the number of switches connected to the transimpedance amplifiers 103 and 104 in the on state and in the off state arises, the capacitance values of the parasitic capacitance on the input node of the transimpedance amplifiers 103 and 104 become different. Accordingly, in spite of the fact that at the time of input the disturbance noise is of the same size, the size of the noise inputted when the parasitic capacitance is propagated differs between the transimpedance amplifier 103 and the transimpedance amplifier 104. In a case where the sizes of the noise respectively inputted into the transimpedance amplifiers 103 and 104 differ, the level of noise that enters the inverting terminal and the non-inverting terminal of the differential operation amplifier 105 differs. Accordingly, in-phase noise components are added together in the differential operation amplifier 105, and a component due to the difference in the sizes of the noise is superimposed on the signal outputted from the differential operation amplifier 105.

Accordingly, the switches 122a and 122b are arranged so that the numbers of switches that are in the on state in the switching unit 102 and are connected to the transimpedance amplifiers 103 and 104 respectively approach each other and so that the numbers of the switches that are in the off state in the switching unit 102 and are connected to the transimpedance amplifiers 103 and 104 respectively approach each other. Also, the switches 122a and 122b are caused to operate as dummy switches. As illustrated in FIG. 1A, the numbers of switches 112 and 122 in the on state and the off state respectively connected to the transimpedance amplifiers 103 and 104 may be the same as each other. Thereby, the capacitance values of the parasitic capacitance connected to the input node of the transimpedance amplifiers 103 and 104 respectively are made to approach each other. As a result, even if disturbance noise is present in the power supply, and noise is present in the inputs of the transimpedance amplifiers 103 and 104, it becomes possible to remove the in-phase noise in the differential operation amplifier 105. By making the difference in capacitance values of the parasitic capacitance on the input node of the two transimpedance amplifiers 103 and 104 smaller, the power supply rejection ratio (PSRR) increases, and it is possible to make the photoelectric conversion apparatus 100 stronger against disturbance noise.

In the configuration illustrated in FIGS. 2A and 2B, the switch of the switching unit 102 was described as an NMOS switch, but there is no limitation thereto, and it may be a PMOS switch or any configuration if a signal outputted from the light receiving element unit 101 can be transmitted thereby. Also, for example, the switches 112, 122a, and 122b of the switching unit 102 each may be configured to have the same capacitance value in the on state, and may be configured to have the same capacitance value in the off state. Furthermore, for example, configuration may be taken such that the switches 112a, 112b, 122a, 122b in the switching unit 102 each have the same structure so as to align their capacitance values in each state. Further, while parasitic capacitance of an NMOS switch in the on state and the off state was described in FIGS. 2A and 2B, other parasitic capacitance components may also arise. For example, a parasitic capacitance in a wiring pattern from the light receiving element unit 101 to the switch 112 may arise. In such a case, the capacitance values of the parasitic capacitance connected to each of the transimpedance amplifiers 103 and 104 including such parasitic capacitance may be made to approach each other. Also, for example, as illustrated in FIG. 1B and FIG. 1C, in order to make the difference in parasitic capacitance in each of the switches 112 and 122 and the parasitic capacitance of a wiring pattern or the like smaller, a power supply that supplies as appropriate a capacitance Cadj and a voltage Vadj to the nodes N1 and N2 may be connected. For example, the capacitance Cadj may have a capacitance value according to the parasitic capacitance of the wiring pattern from the light receiving element unit 101 to the switch 112. Also, for example, the voltage Vadj may be the same as the reference voltage Vref, and it may be a ground voltage. Also, the capacitance Cadj and the voltage Vadj may have the same values at the node N1 and the node N2, or those values may be different from each other.

Figure 3:
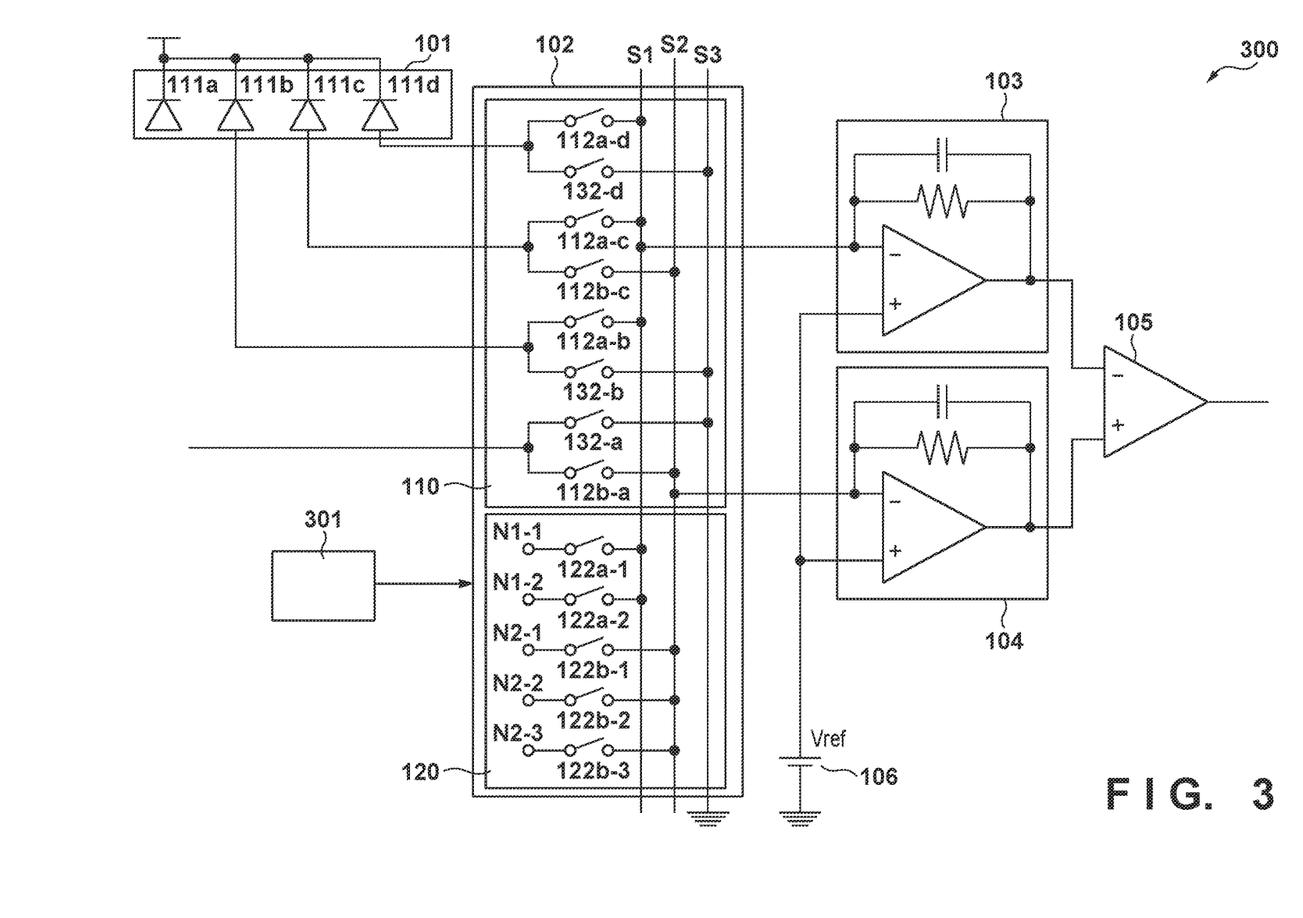
FIG. 3 is a circuit diagram which illustrates a configuration of a photoelectric conversion device according to embodiments of the present invention.

A configuration of the photoelectric conversion device according to an embodiment of the present invention will be described with reference to FIGS. 3-5. FIG. 3 is a circuit diagram that illustrates a configuration of a photoelectric conversion apparatus 300 in a second embodiment of the present invention. The photoelectric conversion apparatus 300 of the present embodiment, in contrast to the photoelectric conversion apparatus 100 of the above-described first embodiment, has a plurality of light receiving elements 111 included in the light receiving element unit 101, and the configuration of the switching unit 102 differs in conjunction therewith. Also, a control unit 301 for controlling the switching unit 102 is included. Other configurations of the photoelectric conversion apparatus 300 may be the same as in the above-described photoelectric conversion apparatus 100.

Next, the light receiving element unit 101, the switching unit 102, and the control unit 301 of the photoelectric conversion apparatus 300 whose configurations differ to in the above-described photoelectric conversion apparatus 100 will be described. In the present embodiment, four light receiving elements 111a to 111d are arranged in the light receiving element unit 101. The output of each of the light receiving elements 111a to 111d is supplied to at least one of the transimpedance amplifier 103 and the transimpedance amplifier 104 via one of the switches 112 of the output switching unit 110 of the switching unit 102. In other words, the anodes of the light receiving elements 111a to 111d are connected to at least one of the switches 112a between the light receiving element unit 101 and the transimpedance amplifier 103 and the switches 112b between the light receiving element unit 101 and the transimpedance amplifier 104.

In the switching unit 102, more switches are arranged than in the photoelectric conversion apparatus 100 in accordance with the number of light receiving elements 111 arranged in the light receiving element unit 101 becoming more numerous. In the output switching unit 110, a plurality of switches 112a are arranged between the light receiving element unit 101 and a node S1 which is connected to the input terminal of the transimpedance amplifier 103. Also, in the output switching unit 110, a plurality of switches 112b are arranged between the light receiving element unit 101 and a node S2 which is connected to the input terminal of the transimpedance amplifier 104. A plurality of switches 122a of the capacitance adjusting unit 120 are arranged between the input terminal of the transimpedance amplifier 103 and a node N1 for adjusting the capacitance value on the input node of the transimpedance amplifier 103. Also, in the capacitance adjusting unit 120, a plurality of switches 122b are arranged between the input terminal of the transimpedance amplifier 104 and a node N2 for adjusting the capacitance value on the input node of the transimpedance amplifier 104. Also, in the output switching unit 110, a plurality of switches 132 may be arranged between the light receiving element unit 101 and a node S3 which is connected to the input terminals of the transimpedance amplifiers 103 and 104. In the present embodiment, the node S3 is grounded.

In the present embodiment, the light receiving elements 111a to 111d are connected to at least one of one of the switches 112a and one of the switches 112b. Specifically, the light receiving element 111a is arranged to be capable of connecting to the transimpedance amplifier 104 via the switch 112b-a and the node S3 via the switch 132-a. The light receiving element 111b is arranged to be capable of connecting to the transimpedance amplifier 103 via the switch 112a-b and the node S3 via the switch 132-b. The light receiving element 111c is arranged to be capable of connecting to the transimpedance amplifier 103 via the switch 112a-c and the transimpedance amplifier 104 via the switch 112b-c. The light receiving element 111d is arranged to be capable of connecting to the transimpedance amplifier 103 via the switch 112a-d and the node S3 via the switch 132-d. The light receiving element 111c is connected to both the switch 112a-c in the switches 112a and the switch 112b-c in the switches 112b, and is arranged to be capable of supplying signals to either of the transimpedance amplifiers 103 and 104. Also, the light receiving elements 111a, 111b, and 111d are connected to at least one switch in the switches 112a and the switches 112b and to one switch in the switches 132.

The control unit 301 performs control for switching the connection destination of each of the light receiving elements 111a to 111d in the light receiving element unit 101. Also, the control unit 301 switches the on state and the off state of switches included in the switches 122a and 122b in the capacitance adjusting unit 120 in accordance with the number of switches in the on state and the number of switches in the off state of each of the switches 112a and 112b in the output switching unit 110. More specifically, the control unit 301 drives the capacitance adjusting unit 120 so that the number of switches in the on state in the switches 112a and 122a connected to the node S1 and the number of switches in the on state in the switches 112b and 122b connected to the node S2 approach each other. By switching the on state and the off state of the switches 122a and 122b of the capacitance adjusting unit 120, the number of switches in the on state that are connected to the node S1 and the node S2 respectively is controlled. Also, the control unit 301 drives the capacitance adjusting unit 120 so that the number of switches in the off state in the switches 112a and 122a connected to the node S1 and the number of switches in the off state in the switches 112b and 122b connected to the node S2 approach each other. By switching the on state and the off state of the switches 122a and 122b of the capacitance adjusting unit 120, the numbers of switches in the off state that are connected to the node S1 and the node S2 respectively are controlled. As described above, the control unit 301 may control the switches 122 of the capacitance adjusting unit 120 so that the numbers of the switches 112 and 122 in the on state that are respectively connected to the node S1 and the node S2 become the same. Furthermore, the control unit 301 may control the switches 122 of the capacitance adjusting unit 120 so that the numbers of the switches 112 and 122 in the off state that are respectively connected to the node S1 and the node S2 become the same.

Next, operation of the photoelectric conversion apparatus 300 will be described. In the photoelectric conversion apparatus 300, in a case where signals from the light receiving element unit 101 are inputted into both the nodes S1 and S2, the intensities of light inputted into the light receiving elements 111a to 111d respectively are processed by the differential operation amplifier 105, and operation as a circuit for performing position detection is possible. Also, in a case where a signal from the light receiving element unit 101 is inputted into one of the nodes S1 and S2, operation as a circuit for monitoring an output voltage in accordance with the amounts of light received by the light receiving elements 111a-111d is possible.

Figure 4:
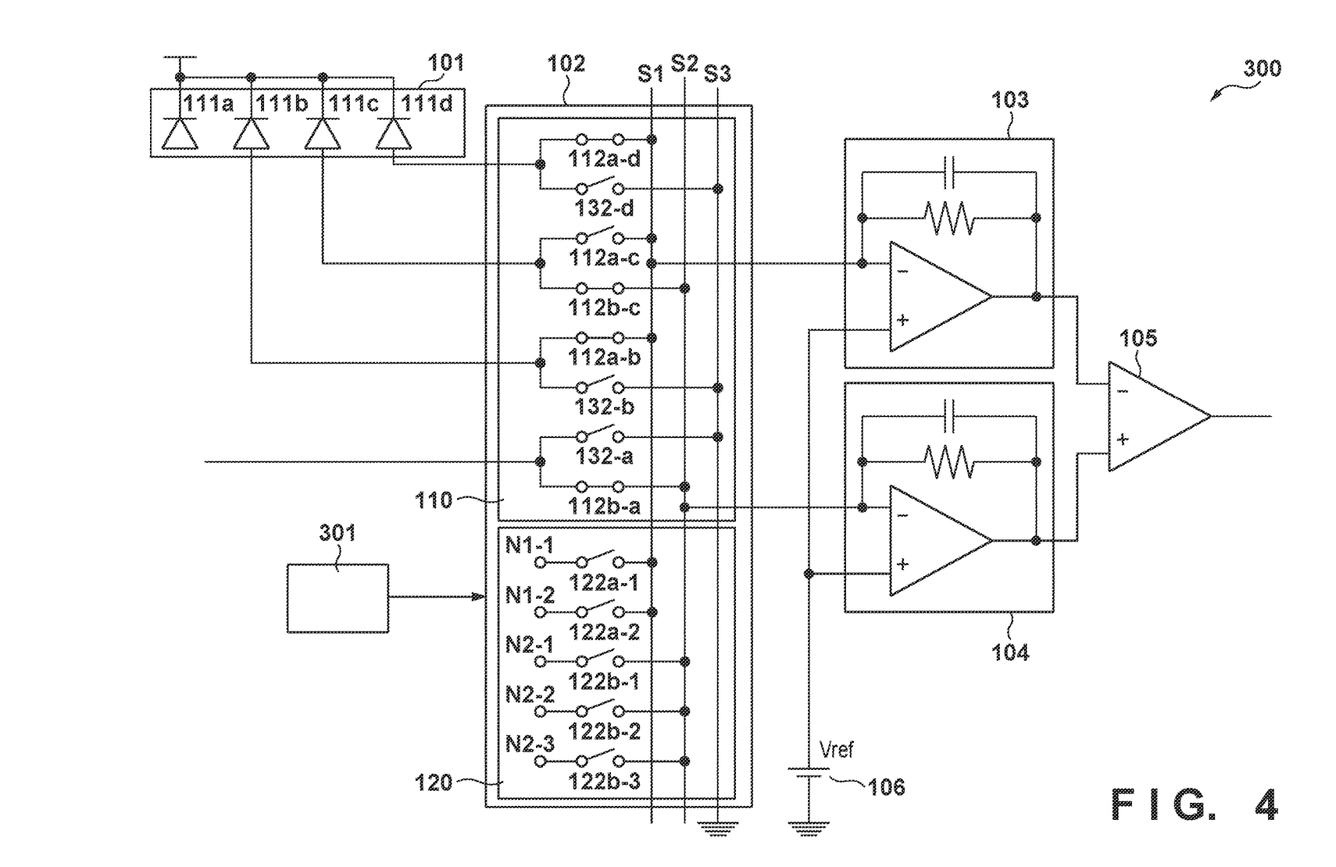
FIG. 4 is a view which illustrates an example of a connection of switches of the switching unit of the photoelectric conversion device of FIG. 3.
Figure 5:
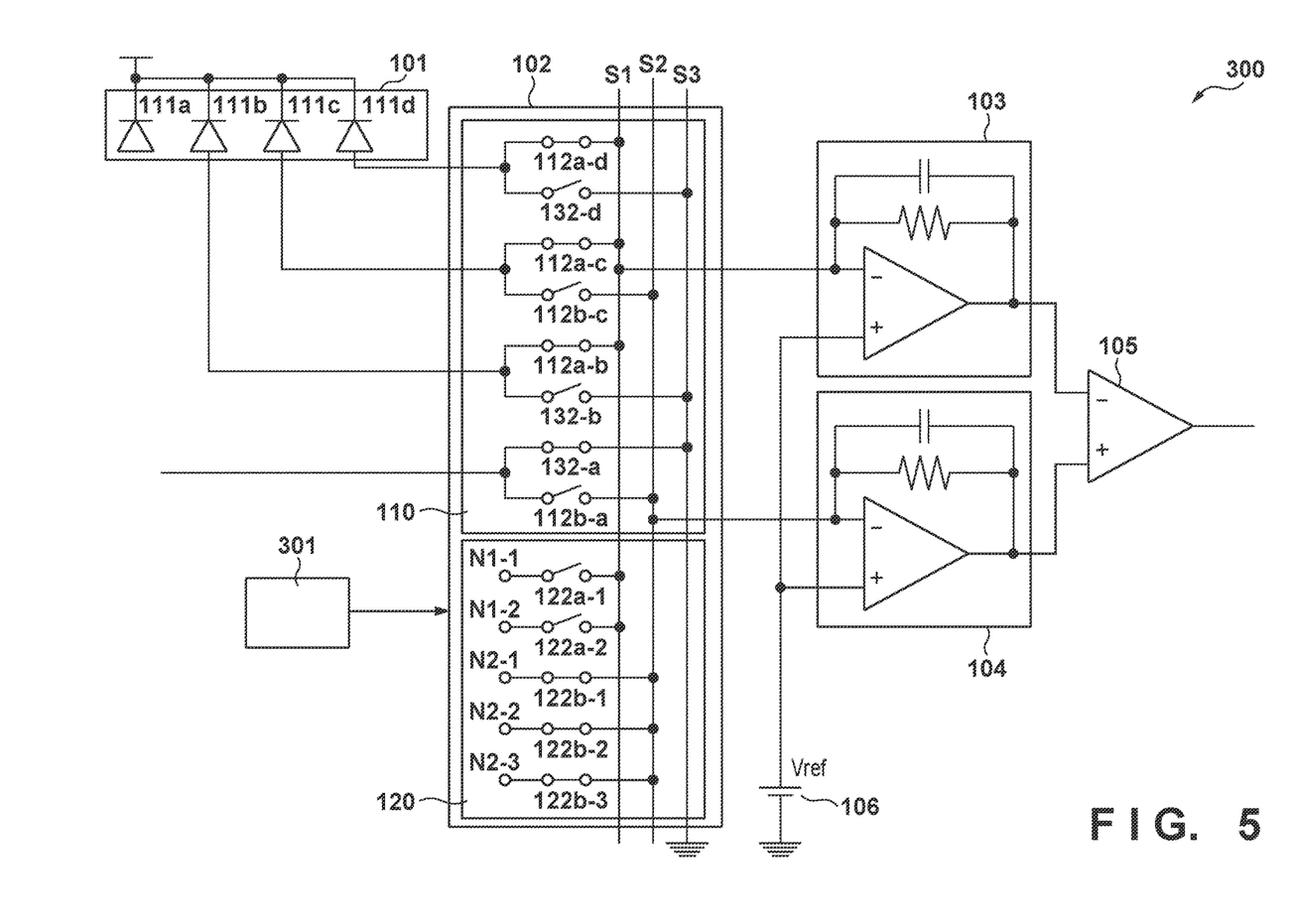
FIG. 5 is a view which illustrates an example of a connection of switches of the switching unit of the photoelectric conversion device of FIG. 3.

FIG. 4 is a circuit diagram that illustrates an example of connections of each of the switches 112, 122, and 132 in the switching unit 102 in a case where position detection is performed. Prior to allowing light to be incident on the light receiving element unit 101, the control unit 301 controls connections of each of the switches 112, 122, and 132 in the switching unit 102. In the configuration illustrated in FIG. 4, the light receiving elements 111a and 111c are connected to the node S2, and a signal is outputted to the transimpedance amplifier 104. The light receiving elements 111b and 111d are connected to the node S1, and a signal is outputted to the transimpedance amplifier 103. The same number of light receiving elements 111 are connected to the two transimpedance amplifiers 103 and 104. The control unit 301, in parallel to the control of the output switching unit 110, also performs control of switches 132 in the capacitance adjusting unit 120. In the case of the configuration illustrated in FIG. 4, there are two switches 112a in the on state connected to the node S1 and one switch 112a in the off state. Also, there are two switches 112b in the on state connected to the node S2 and zero switches 112b in the off state. The numbers of switches 112a and 112b in the off state differs between the node S1 and the node S2. Accordingly, the control unit 301 controls the switches 122a and 122b of the capacitance adjusting unit 120 such that the numbers of the switches 112a, 112b, 122a, 122b in the off state on the node S1 and the node S2 approach each other. In the configuration illustrated in FIG. 4, it is possible to cause the number of switches in the on state and the number of switches in the off state in the switches 112 and 122 connected to the node S1 and the node S2 to match each other by putting all of the switches 122 of the capacitance adjusting unit 120 in the off state. The control unit 301 allows light to be incident on the light receiving element unit 101 after setting the connection destinations of the switches 112, 122, and 132 in the switching unit 102.

For example, light produced from an emitting unit (not shown) such as a light emitting diode is irradiated onto a shaded reflection scale (not shown), and when the reflection scale is moved in a direction in which the light receiving elements 111 are arranged, light that reflected on the shaded reflection scale is incident on the light receiving element 111. At this time, the control unit 301 designates the connection destinations of the light receiving elements 111a to 111d in advance so that the signals necessary for position detection are outputted from the two transimpedance amplifiers 103 and 104. Configuration may be taken to prepare two of the photoelectric conversion apparatus 300, and to perform position detection from the signals outputted from the differential operation amplifier 105 of each of the two photoelectric conversion apparatuses 300.

Next, using FIG. 5, description will be given of a case where the photoelectric conversion apparatus 300 is used as a circuit for monitoring an output voltage in accordance with amounts of light received by the light receiving elements 111a-111d. FIG. 5 is a circuit diagram that illustrates an example of connections of each of the switches 112, 122, and 132 in the switching unit 102 in a case of monitoring output voltage.

Similarly to the case of performing a position detection in FIG. 4 as described above, prior to allowing light to be incident on the light receiving element unit 101, the control unit 301 controls connections of each of the switches 112, 122, and 132 in the switching unit 102. In the configuration illustrated in FIG. 5, the light receiving element 111a is connected to the node S3. Also, the light receiving elements 111b-111d are connected to the node S1, and a signal is outputted to the transimpedance amplifier 103. The control unit 301, in parallel to the control of the output switching unit 110, also performs control of switches 132 in the capacitance adjusting unit 120. In the case of the configuration illustrated in FIG. 5, there are three switches 112a in the on state connected to the node S1 and zero switches 112a in the off state. Also, there are zero switches 112b in the on state connected to the node S2 and two switches 112b in the off state. The numbers of switches 112a and 112b in the on state and the off state differ between the node S1 and the node S2. Accordingly, the control unit 301 controls the switches 122a and 122b of the capacitance adjusting unit 120 such that the numbers of the switches 112a, 112b, 122a, 122b in on state and in the off state on the node S1 and the node S2 approach each other. In the configuration illustrated in FIG. 5, all of the switches 122a of the capacitance adjusting unit 120 are put in the off state and all of the switches 122b are put in the on state. Thereby, it is possible to cause the number of switches in the on state and the number of switches in the off state among the switches 112 and 122 connected to the node S1 and the node S2 to match. The control unit 301 allows light to be incident on the light receiving element unit 101 after setting the connection destinations of the switches 112, 122, and 132 in the switching unit 102.

Light is allowed to be incident on the light receiving element unit 101, and each of the light receiving elements 111 outputs to the switching unit 102 a signal according to the amount of light received. In the configuration illustrated in FIG. 5, a signal is inputted only to the transimpedance amplifier 103 via the node S1, and a signal is not inputted to the transimpedance amplifier 104 connected to the node S2. In the differential operation amplifier 105, it is possible to monitor the amount of light incident on the light receiving element unit 101 by obtaining the difference in voltages outputted from the two transimpedance amplifiers 103 and 104.

Even in the present embodiment, configuration may be taken to connect a power supply for supplying the capacitance Cadj and the voltage Vadj as illustrated in FIG. 1B and FIG. 1C to the nodes N1 and N2 for adjusting the capacitance values on the input node of the transimpedance amplifiers 103 and 104. Also, the capacitance Cadj and the voltage Vadj may have the same values at the node N1 and the node N2, or those values may be different from each other. Also, for example, the capacitance Cadj and the voltage Vadj may have respectively different values at the node N1-1 and the node N1-2. Similarly, the capacitance Cadj and the voltage Vadj may have respectively different values at the node N2-1, the node N2-2, and the node N2-3.

In the present embodiment, even in the case where a plurality of light receiving elements 111 are arranged in the light receiving element unit 101, it is possible to cause the numbers of the switches 112, 122, and 132 in the on state and the off state that are respectively connected to the two transimpedance amplifiers 103 and 104 to approach each other. Thereby, it is possible to make the difference in capacitance values of the parasitic capacitance on the input node of the two transimpedance amplifiers 103 and 104 smaller, the power supply rejection ratio (PSRR) increases, and it is possible to make the photoelectric conversion apparatus 100 stronger against disturbance noise.

Also, in the present embodiment, a case in which the number of light receiving elements 111 arranged in the light receiving element unit 101 is four is illustrated, but it may be two or three and it may be five or more. Also, the arrangement of the switches 112, 122, and 132 is not limited to the above-described configuration. Configuration may be taken such that the numbers of switches 112, 122, and 132 that are in the on state and are respectively connected to the two transimpedance amplifiers 103 and 104 approach each other and so that the numbers of the switches 112, 122, and 132 that are in the off state and are respectively connected to the transimpedance amplifiers 103 and 104 approach each other.

While embodiments according to the present invention were described above, it goes without saying that the present invention is not limited to these embodiments, and the above-described embodiments can be modified and combined as appropriate within a scope that does not deviate from the spirit of the present invention. For example, in the configuration illustrated in FIG. 1A, the light receiving element unit 101 may have two light receiving elements 111, and the anode of one of the light receiving elements 111 may be connected to the switch 112a and anode of the other light receiving element 111 may be connected to the switch 112b. In such a configuration, the switches 112a and 112b may be put into the on state and the switches 122a and 122b into the off state in the case of performing a position detection. Also, in the case of monitoring an output voltage according to an amount of light received, configuration may be taken to put the switches 112a and 122b in the on state and the switches 112b and 122a in the off state, or into opposite states thereto. Thereby, it is possible to reduce the difference in the capacitance value of parasitic capacitance on the input node of the two transimpedance amplifiers 103 and 104.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-028419, filed Feb. 17, 2017, which is hereby incorporated by reference wherein in its entirety.

What is claimed is:

1. A photoelectric conversion device, comprising:
   a light receiving element unit including a light receiving element;
   first and second transimpedance amplifiers configured to receive a signal outputted from the light receiving element unit and output a voltage corresponding to the signal;
   a differential operation amplifier configured to perform a differential amplification for outputs of the first and second transimpedance amplifiers; and
   a switching unit, wherein
   the switching unit includes:
   an output switching unit configured to switch connections between a first state where the light receiving element unit and the first transimpedance amplifier are connected and a second state where the light receiving element unit and the second transimpedance amplifier are connected; and
   a capacitance adjusting unit connected to an input terminal of each of the first and second transimpedance amplifiers and configured to adjust a capacitance value of an input node of the first transimpedance amplifier and/or a capacitance value of an input node of the second transimpedance amplifier.

2. The photoelectric conversion device according to claim 1, wherein
   the capacitance adjusting unit connects the first transimpedance amplifier to one or more first nodes for adjusting the capacitance value of the input node of the first transimpedance amplifier, and
   the capacitance adjusting unit connects the second transimpedance amplifier to one or more second nodes for adjusting a capacitance value of the input node of the second transimpedance amplifier.

3. The photoelectric conversion device according to claim 2, wherein
   the output switching unit includes one or more first switches arranged between the light receiving element unit and the input node of the first transimpedance amplifier and one or more second switches arranged between the light receiving element unit and the input node of the second transimpedance amplifier, and
   the capacitance adjusting unit includes one or more third switches arranged between the one or more first nodes and the input node of the first transimpedance amplifier and one or more fourth switches arranged between the one or more second nodes and the input node of the second transimpedance amplifier.

4. The photoelectric conversion device according to claim 3, wherein
   the photoelectric conversion device further comprises a control unit configured to control the switching unit, and
   the control unit switches the one or more third switches and the one or more fourth switches individually between an on state and an off state, in accordance with the number of switches in an on state and the number of switches in an off state for each of the one or more first switches and the one or more second switches.

5. The photoelectric conversion device according to claim 4, wherein the control unit switches the one or more third switches and the one or more fourth switches individually between the on state and the off state,
   so that the number of switches in the on state out of the one or more first switches and the one or more third switches connected to the input terminal of the first transimpedance amplifier and the number of switches in the on state out of the one or more second switches and the one or more fourth switches connected to the input terminal of the second transimpedance amplifier approach each other, and
   so that the number of switches in the off state out of the one or more first switches and the one or more third switches connected to the input terminal of the first transimpedance amplifier and the number of switches in the off state out of the one or more second switches and the one or more fourth switches connected to the input terminal of the second transimpedance amplifier approach each other.

6. The photoelectric conversion device according to claim 4, wherein the control unit switches the one or more third switches and the one or more fourth switches switches individually between the on state and the off state, so that the number of switches in the on state among the one or more first switches and the one or more third switches is the same as the number of switches in the on state among the one or more second switches and the one or more fourth switches.

7. The photoelectric conversion device according to claim 4, wherein the control unit switches the one or more third switches and the one or more fourth switches switches individually between the on state and the off state, so that the number of switches in the off state among the one or more first switches and the one or more third switches is the same as the number of switches in the off state among the one or more second switches and the one or more fourth switches.

8. The photoelectric conversion device according to claim 3, wherein
the light receiving element unit includes a plurality of light receiving elements, and
each of the plurality of light receiving elements is connected to at least one switch among the one or more first switches and the one or more second switches.

9. The photoelectric conversion device according to claim 8, wherein the plurality of light receiving elements includes a light receiving element connected to both one of the one or more first switches and one of the one or more second switches.

10. The photoelectric conversion device according to claim 8, wherein
the output switching unit includes one or more fifth switches arranged between the light receiving element unit and a third node that is not connected to the input nodes of the first and second transimpedance amplifiers,
and the plurality of light receiving elements includes a light receiving element connected to at least one switch among the one or more first switches and the one or more second switches and connected to one of the one or more fifth switches.

11. The photoelectric conversion device according to claim 10, wherein the third node is grounded.

12. The photoelectric conversion device according to claim 3, wherein
the switches of each of the one or more first switches, the one or more second switches, the one or more third switches, and the one or more fourth switches are configured by a CMOS switch that includes a MOS transistor,
parasitic capacitance in an on state of the switches of each of the one or more first switches, the one or more second switches, the one or more third switches, and the one or more fourth switches has the same capacitance value, and
parasitic capacitance in an off state of the switches of each of the one or more first switches, the one or more second switches, the one or more third switches, and the one or more fourth switches has the same capacitance value.

13. The photoelectric conversion device according to claim 3, wherein the switches of each of the one or more first switches, the one or more second switches, the one or more third switches, and the one or more fourth switches have the same configuration.

14. The photoelectric conversion device according to claim 2, wherein the one or more first nodes and the one or more second nodes are floating.

15. The photoelectric conversion device according to claim 1, wherein the photoelectric conversion device further includes a reference voltage unit connected to a non-inverting terminal of each of the first and second transimpedance amplifiers.

16. A photoelectric conversion device, comprising:
a light receiving element unit including a light receiving element;
first and second transimpedance amplifiers configured to receive a signal outputted from the light receiving element unit and output a voltage corresponding to the signal;
a differential operation amplifier configured to perform a differential amplification for outputs of the first and second transimpedance amplifiers; and
a switching unit, wherein
the switching unit includes:
one or more first switches arranged between the light receiving element unit and an input node of the first transimpedance amplifier;
one or more second switches arranged between the light receiving element unit and an input node of the second transimpedance amplifier;
one or more third switches arranged between the first transimpedance amplifier and one or more first nodes; and
one or more fourth switches arranged between the second transimpedance amplifier and one or more second nodes.

17. The photoelectric conversion device according to claim 16, wherein in accordance with the number of switches in an on state and the number of switches in an off state for each of the one or more first switches and the one or more second switches, of the one or more third switches and the one or more fourth switches are individually switched between the on state and the off state.

18. A photoelectric conversion device, comprising:
a light receiving element unit including a light receiving element;
first and second transimpedance amplifiers configured to receive a signal outputted from the light receiving element unit and output a voltage corresponding to the signal;
a differential operation amplifier configured to perform a differential amplification for outputs of the first and second transimpedance amplifiers; and
a switching unit, wherein
the switching unit has:
a first switch connected between the light receiving element unit and the first transimpedance amplifier;
a second switch connected between a node other than the light receiving element unit and the first transimpedance amplifier;
a third switch connected between the light receiving element unit and the second transimpedance amplifier; and
a fourth switch connected between a node other than the light receiving element unit and the second transimpedance amplifier.

* * * * *